United States Patent

Sander et al.

[11] Patent Number: 5,994,752
[45] Date of Patent: Nov. 30, 1999

[54] FIELD-EFFECT-CONTROLLABLE SEMICONDUCTOR COMPONENT WITH A PLURALITY OF TEMPERATURE SENSORS

[75] Inventors: Rainald Sander, Munich; Alfons Graf, Kaufering, both of Germany

[73] Assignee: Siemens Aktiengesellschaft, Munich, Germany

[21] Appl. No.: 08/715,426

[22] Filed: Sep. 18, 1996

[30] Foreign Application Priority Data

Sep. 18, 1995 [DE] Germany .................... 195 34 604

[51] Int. Cl.⁶ .................... H01L 31/058; H01L 29/76
[52] U.S. Cl. .................... 257/467; 257/337; 257/470
[58] Field of Search .................... 257/341, 328, 257/334, 337, 467, 469, 470

[56] References Cited

U.S. PATENT DOCUMENTS

| | | | |
|---|---|---|---|
| 5,434,443 | 7/1995 | Kelly et al. | 257/467 |
| 5,521,421 | 5/1996 | Furuhata | 257/467 |

FOREIGN PATENT DOCUMENTS

| | | | |
|---|---|---|---|
| 0 224 274 B1 | 6/1987 | European Pat. Off. | 257/467 |
| 41 22 653 A1 | 1/1993 | Germany | 257/467 |
| 1-73635 | 3/1989 | Japan | 257/467 |

OTHER PUBLICATIONS

"On Chip Temperature Sensor", IBM Technical Disclosure Bulletin, vol. 36, No. 8, Aug. 1993, pp. 489–491.

Primary Examiner—Steven H. Loke
Attorney, Agent, or Firm—Herbert L. Lerner; Laurence A. Greenberg

[57] ABSTRACT

A field-effect-controllable power semiconductor component, such as a power MOSFET or IGBT, includes a semiconductor body, at least one cell field, a multiplicity of mutually parallel-connected transistor cells disposed in the at least one cell field, and at least two temperature sensors integrated in the semiconductor body and disposed at different locations from each other on the semiconductor body. Thus a temperature gradient between a strongly heated local region of the semiconductor body and one of the temperature sensors is reduced and a response time in the event of an overload is shortened.

9 Claims, 2 Drawing Sheets

FIELD-EFFECT-CONTROLLABLE SEMICONDUCTOR COMPONENT WITH A PLURALITY OF TEMPERATURE SENSORS

BACKGROUND OF THE INVENTION

1. Field of the Invention

The invention relates to a field-effect-controllable power semiconductor component with a semiconductor body and a multiplicity of mutually parallel-connected transistor cells disposed in at least one cell field.

In order to protect such a semiconductor component which, for instance, may be a power MOSFET or an IGBT, from overload, it has been proposed, for instance in Published European Patent Application 0 224 274, that a temperature sensor be disposed in the center of the semiconductor body. The temperature sensor is seated in a recess of a field of transistor cells that are connected parallel to one another.

If the load is entirely or partially short-circuited, then the semiconductor body heats up because of discontinuities at preferential local points. After a time, which is determined by a transient thermal resistance between those points and the temperature sensor, the sensor detects the excess temperature and switches the power semiconductor component off.

In high-power semiconductor components, the area of the semiconductor body must be made greater. However, as the area of the semiconductor body increases, the likelihood that the power semiconductor component will be destroyed before the temperature sensor responds, increases as well.

2. Summary of the Invention

It is accordingly an object of the invention to provide a field-effect-controllable power semiconductor component with a plurality of temperature sensors, which overcomes the hereinafore-mentioned disadvantages of the heretofore-known devices of this general type in such a way that the likelihood of destruction from an overload is drastically reduced.

With the foregoing and other objects in view there is provided, in accordance with the invention, a field-effect-controllable power semiconductor component, comprising a semiconductor body; at least one cell field; a multiplicity of mutually parallel-connected transistor cells disposed in the at least one cell field; and at least two temperature sensors integrated in the semiconductor body and disposed at different locations from each other on the semiconductor body.

In accordance with another feature of the invention, the at least one cell field includes at least two spaced-apart cell fields on the semiconductor body, the transistor cells are disposed in the at least two spaced-apart cell fields, and each of the cell fields includes a respective one of the temperature sensors.

In accordance with a further feature of the invention, the temperature sensors are disposed at a location of the cell fields where a highest temperature is to be expected.

In accordance with an added feature of the invention, the cell fields are spaced apart from one another by a distance being on the same order of magnitude as a thickness of the semiconductor body.

In accordance with an additional feature of the invention, there are provided peripheral structures each surrounding a respective one of the cell fields.

In accordance with yet another feature of the invention, there is provided a trigger circuit furnishing a control voltage for the semiconductor component and reducing the control voltage as long as at least one of the temperature sensors outputs a signal.

In accordance with yet a further feature of the invention, there is provided a trigger circuit furnishing a control voltage for all of the cell fields and reducing the control voltage for all of the cell fields as long as at least one of the temperature sensors outputs a signal.

In accordance with a concomitant feature of the invention, there are provided trigger circuits each furnishing a control voltage and reducing the control voltage for a respective one of the cell fields as long as one of the temperature sensors associated with the one cell field outputs a signal.

Other features which are considered as characteristic for the invention are set forth in the appended claims.

Although the invention is illustrated and described herein as embodied in a field-effect-controllable semiconductor component with a plurality of temperature sensors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
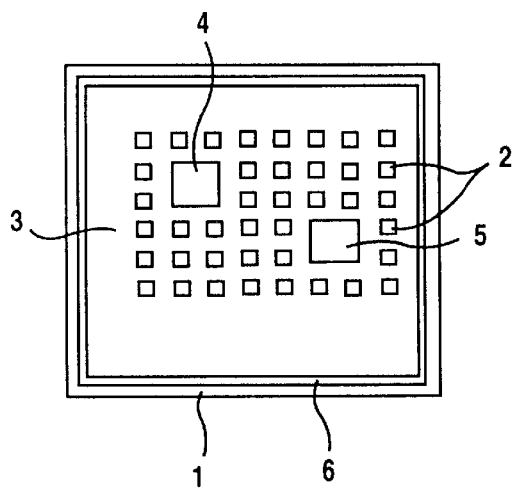
FIG. 1 is a diagrammatic plan view of a first exemplary embodiment.

Referring now to the figures of the drawings in detail and first, particularly, to FIG. 1 thereof, there is seen a power semiconductor component which has a semiconductor body 1 with many field-effect-controlled transistor cells 2. These transistor cells are integrated with the semiconductor body in a known manner and are connected parallel to one another. Typically, they are controlled by a gate electrode that is common to all of the transistor cells, but the gate electrode has been omitted in this case for the sake of simplicity. The transistor cells 2 are disposed geometrically in the form of a cell field 3. The number of cells may be several tens of thousands, for instance. For the sake of simplicity, only a few cells 2 are shown in this case, which are also greatly enlarged in proportion to the area of the semiconductor body.

Inside the cell field 3, two temperature sensors 4, 5 are integrated with the semiconductor body, at various locations of the semiconductor body. It is also possible for more than two temperature sensors to be integrated with the semiconductor body. These temperature sensors may, for instance, be bipolar transistors or diodes.

A load current that is elevated over the rated current flows in the case of an overload, for instance due to partial or complete short-circuiting of the load. Due to unavoidable discontinuities, this elevated load current concentrates at one or more transistor cells 2 of the cell field 3. These cells thus heat severely and warm the semiconductor body. As compared with a semiconductor body having only a single temperature sensor, the temperature gradient is less because of the smaller spacing between an overloaded cell and one of the sensors. The temperature sensor adjacent the aforementioned cell therefore responds more quickly. Its signal can be supplied to a trigger circuit, which either turns off the power semiconductor component completely or reduces the current, by reducing the control voltage, far enough to ensure that the power semiconductor component is turned off by an external signal. This makes it possible to prevent the power semiconductor component from being destroyed.

Figure 3:
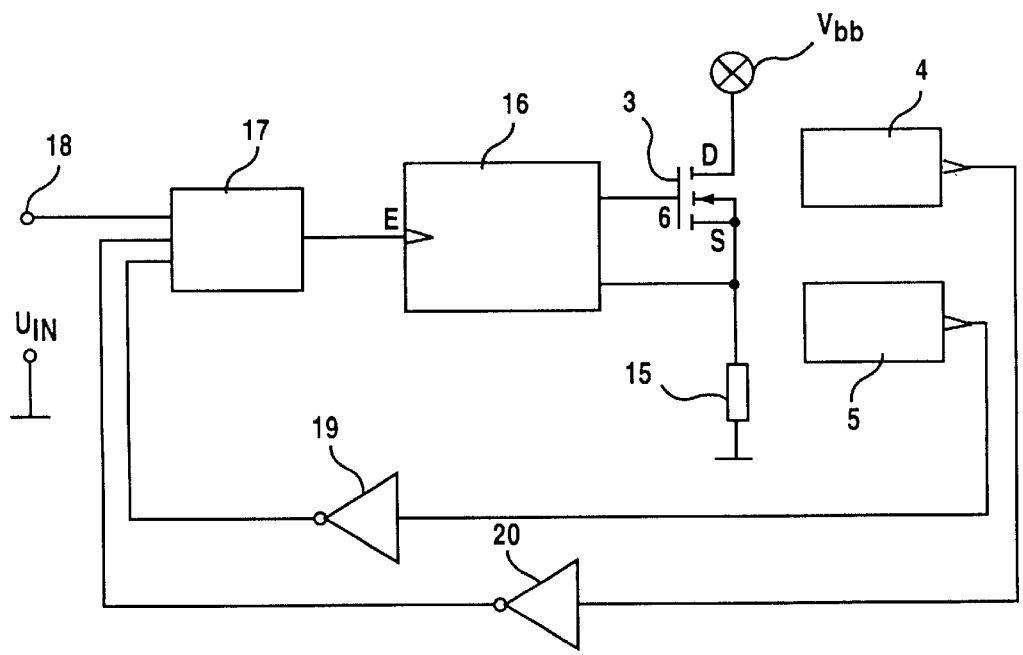
FIGS. 3–5 are schematic and block diagrams of various circuits configurations in which temperature sensors are joined in various ways to trigger circuits that control power semiconductor components.

FIG. 3 shows an exemplary embodiment of a trigger circuit for the power semiconductor component of FIG. 1. The power semiconductor component includes the cell field 3 and is also represented by reference numeral 3. A load 15 is connected in series with the power semiconductor component 3 on the source side. The series circuit is connected to a voltage $V_{bb}$. A control voltage is furnished by a trigger circuit 16 and is applied between a gate terminal G and a source terminal S. The trigger circuit 16 is enabled at an input E (for enable) by a logic circuit 17 (AND circuit), if a control voltage $U_{in}$ is present at a control input 18 and the temperature sensors 4, 5 have an output level L. This is the case at normal operating temperature. The temperature sensors 4, 5 are connected through inverters 19, 20 to two further inputs of the logic circuit 17.

If one or both of the temperature sensors 4, 5 have responded, then the trigger circuit 16 is blocked through the logic circuit 17 at the input E, and the power semiconductor component is turned off. However, its load current may also be merely reduced until the power semiconductor component is turned off externally by a signal at the control input 18.

Figure 2:
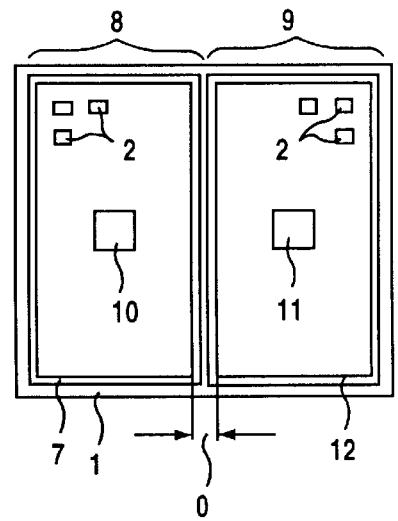
FIG. 2 is a plan view of a second exemplary embodiment.

In the exemplary embodiment of FIG. 2, the semiconductor body is again identified by reference numeral 1. The transistor cells 2 in this case are disposed in the form of two cell fields 8, 9 on the semiconductor body 1. The cell fields are spaced apart from one another by a distance "a", which is on the same order of magnitude as the thickness of the semiconductor body. For instance, if the thickness of the semiconductor body is 300 μm, then the spacing "a" may be 100 μm. A temperature sensor 10 is disposed in the cell field 8 and a temperature sensor 11 in the cell field 9. The temperature sensors 10, 11 are preferably located where the highest temperature is to be expected. This is the geometric center, or in other words the intersection of the diagonals of the cell fields 8, 9. There may also be more than one temperature sensor per cell field.

The spacing of one or more of the overloaded cells from the temperature sensor becomes relatively small by dividing an equal number of transistor cells into two or more cell fields. The area between the cell fields acts as a heat sink. As a result, the cell fields may be considered to be thermally-dynamically separate power semiconductor components, with a ratio of peripheral length to surface area that is greater than in the semiconductor component of FIG. 1. In static normal operation, the division of the cell fields does not produce any differences in temperature. However, in the dynamic overload case the overheating cells are distributed over a relatively small surface area around the geometric center of the divided cell fields.

Figure 4:
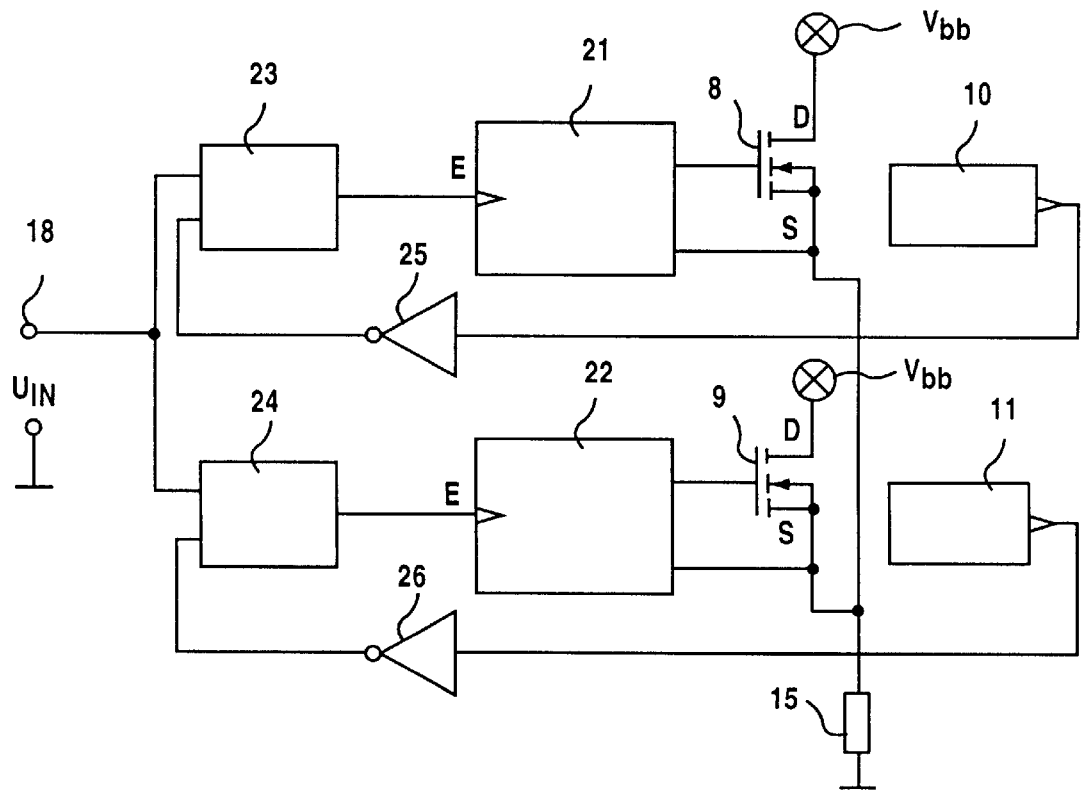

In an overload, the cell fields may be turned off separately or jointly. The circuit of FIG. 4 is suitable, for instance, for separately turning off the cell fields. In the circuit of FIG. 4, two power semiconductor components are connected in parallel. The power semiconductor components are formed by the cell fields 8 and 9 and are also identified by reference numerals 8, 9. The temperature sensor 10 that belongs to the cell field 8 is connected through an inverter 25 to a first input of a logic circuit 23 (AND). A second input of this logic circuit is connected to the control input 18. An output of the logic circuit 23 is connected to an input E (enable) of a trigger circuit 21. The function of this trigger circuit is equivalent to that of the trigger circuit 16 of FIG. 3.

The temperature sensor 11 belonging to the cell field 9 is connected on the output side, through an inverter 26, to a first input of a logic circuit 24 (AND) having a second input which is connected to the control input 18. An output of the logic circuit 24 is connected to an input E of a trigger circuit 22, having an output at which a control voltage for the cell field 9 is located. The cell fields 8, 9 are connected parallel to one another and are connected on their source side to the load 15.

If the temperature sensor 10 signals an excess temperature, then the signal H is present at its output. This signal is inverted in the inverter 25. The signal L is then present at the one input of the logic circuit 23, and the cell field 8 is blocked through the trigger circuit 21, or as an alternative the load current is reduced.

In the same way, the cell field 9 is controlled through the temperature sensor 11, the inverter 26, the logic circuit 24, and the trigger circuit 22. If an overload appears in only one of the two cell fields, then that field is blocked, while the other cell field continues to operate at the rated current.

Figure 5:
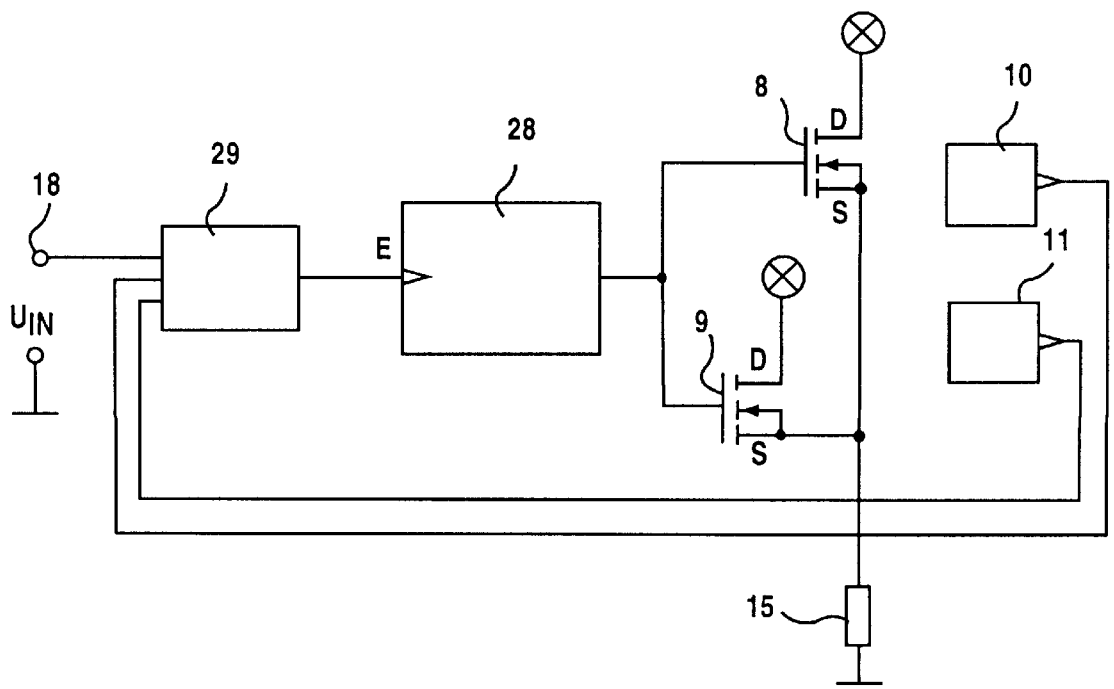

The circuit configuration of FIG. 5 differs from that of FIG. 4 in that the outputs of both temperature sensors 10, 11 and the control input 18 are applied to an AND gate 29 that has three inputs. If one of the temperature sensors 10, 11 signals an excess temperature, then both cell fields 8, 9 and thus the entire power semiconductor component are blocked.

The exemplary embodiment of FIG. 2 may also be modified in such a way that the semiconductor body includes more than two cell fields, each with one temperature sensor. In order not to worsen the electrical properties, such as the breakdown voltage and blocking current, the cell fields are preferably surrounded by peripheral structures, which are identified by reference numerals 7 and 12 in FIG. 2 and reference numeral 6 in FIG. 1. Such peripheral structures are known and typically they include at least one field plate and a channel stopper electrode. For further details, reference may be made, for instance, to European Patents 0 037 115 and 0 077 481.

The trigger circuits may be integrated together with the power semiconductor component in a single semiconductor body.

We claim:

1. A field-effect-controllable power semiconductor component, comprising:

a semiconductor body;

at least two spaced-apart cell fields on said semiconductor body;

a multiplicity of mutually parallel-connected transistor cells disposed in said at least two spaced-apart cell fields;

at least two temperature sensors integrated in said semiconductor body, one of said temperature sensors disposed in each of said cell fields, said at least two temperature sensors each producing a temperature output signal; and a trigger circuit receiving said temperature output signal of at least one of said at least two temperature sensors for limiting a load current.

2. The power semiconductor component according to claim 1, wherein each of said temperature sensors is disposed at a location in respecting one of said cell fields where a highest temperature is to be expected.

3. The power semiconductor component according to claim 1, wherein said cell fields are spaced apart from one another by a distance being on the same order of magnitude as a thickness of said semiconductor body.

4. The power semiconductor component according to claim 3, including peripheral structures each surrounding a respective one of said cell fields.

5. The power semiconductor component according to claim 1, wherein said trigger circuit furnishes a control voltage for all of said cell fields and reducing the control voltage for all of said cell fields as long as at least one of said temperature sensors indicates an over temperature condition via said temperature output signal.

6. The power semiconductor component according to claim 1, wherein said trigger circuit is one of a plurality of trigger circuits each furnishing a control voltage and reducing the control voltage for a respective one of said cell fields as long as one of said temperature sensors associated with said one cell field indicates an over temperature condition via said temperature output signal.

7. The power semiconductor component according to claim 1, wherein each of said cell fields has a geometric center and each of said temperature sensors is disposed at said geometric center of a respective one of said cell fields.

8. The power semiconductor component according to claim 1, wherein said temperature sensors are formed from bipolar transistors.

9. The power semiconductor component according to claim 1, wherein said temperature sensors are formed from diodes.

* * * * *